(12) United States Patent
Bartley et al.

(10) Patent No.: US 9,265,155 B2
(45) Date of Patent: Feb. 16, 2016

(54) FLEXIBLE REWORK DEVICE

(71) Applicant: International Business Machines Corporation, Armonk, NY (US)

(72) Inventors: Gerald K Bartley, Rochester, MN (US); David J Braun, St. Charles, MN (US); John R Dangler, Rochester, MN (US); Matthew S Doyle, Rochester, MN (US); Thomas D Kidd, Stewartville, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 288 days.

(21) Appl. No.: 13/843,108

(22) Filed: Mar. 15, 2013

(65) Prior Publication Data
US 2014/0259653 A1    Sep. 18, 2014

(51) Int. Cl.
*H05K 3/22* (2006.01)
*H05K 3/40* (2006.01)

(52) U.S. Cl.
CPC .............. *H05K 3/225* (2013.01); *H05K 3/4046* (2013.01); *Y10T 29/49124* (2015.01)

(58) Field of Classification Search
CPC ....... H01L 21/768; H01L 24/00; H01L 25/00; H05K 3/225; H05K 3/4046; Y10T 29/49124
See application file for complete search history.

(56) References Cited

U.S. PATENT DOCUMENTS

| 4,438,561 | A | | 3/1984 | Mueller |
| 5,834,705 | A | | 11/1998 | Jonaidi |
| 5,974,662 | A | * | 11/1999 | Eldridge et al. ................ 29/842 |
| 6,830,176 | B2 | | 12/2004 | Sinkunas et al. |
| 6,840,428 | B2 | | 1/2005 | Wong et al. |
| 7,199,309 | B2 | | 4/2007 | Chamberlin et al. |
| 7,399,930 | B1 | | 7/2008 | Palmeri et al. |
| 7,790,985 | B2 | | 9/2010 | Palmeri et al. |
| 2007/0057685 | A1 | * | 3/2007 | Garabedian et al. .......... 324/756 |
| 2007/0075717 | A1 | * | 4/2007 | Kinghorn et al. ............. 324/754 |

FOREIGN PATENT DOCUMENTS

| EP | 0115460 | 8/1984 |
| EP | 0137279 | 6/1991 |
| EP | 0430842 | 6/1991 |

* cited by examiner

*Primary Examiner* — Carl Arbes
(74) *Attorney, Agent, or Firm* — Marcia L. Doubet

(57) ABSTRACT

A rework device in form of a flexible circuit is provided in order to repair a printed circuit assembly. The printed circuit assembly includes one or more through vias and interconnections. The flexible circuit includes a lead in portion and a tail portion. The flexible circuit also includes a first distended head portion proximal to the lead in portion and a second distended head portion proximal to the tail portion. Further, the second distended head portion is connected to the first distended head portion through a coverlay portion. The flexible circuit provided is adapted to be threaded through a through via to repair the printed circuit assembly.

22 Claims, 9 Drawing Sheets

FLEXIBLE REWORK DEVICE

FIELD OF INVENTION

The present disclosure relates to a printed circuit assembly. More particularly the present invention relates to a rework device that enables repair or rework of a defective printed circuit assembly.

BACKGROUND

Printed circuit assemblies are used for numerous electronic applications these days. The printed circuit assemblies contain a number of interconnections, wirings, through vias and plated through holes extending from external connections on one surface of the printed circuit assembly to wirings and connections on the opposite surface.

Often the printed circuit assemblies because of incorrect design or manufacturing errors end up carrying defects. The defects in the printed circuit assemblies may include undesirable short circuits, open circuits or misrouted traces. Even a single defect in one of a plurality of connections on the printed circuit assemblies can lead to the entire assembly being deemed defective. The defect in the connection and associated through vias must be either repaired or completely replaced else the defective printed circuit assemblies will have to be discarded.

There are a few known solutions for repairing of defective printed circuit assemblies. One solution being deep deletion of the defective through via. The deleted through via is then filled with an epoxy solution and then a new through via is drilled and the connections are soldered again.

The problem with such a solution is that additional wires need to be added to the printed circuit assembly. Also, since the printed circuit assembly have a plurality of interconnections; it becomes difficult to solder new interconnections in such a tight package of the plurality of interconnections. Such soldering may also lead to short circuits and some other additional defects in the printed circuit assemblies.

Also, in cases of Land Grid Array (LGA) applications, multiple interposers are used in a stacked structure to repair a defective LGA. The stacked structure may lead to overcrowding of interconnections in the LGA and may lead to short circuits within the LGA.

Therefore, in light of above discussion there is a need of a solution that facilitates easy and safe rework of defective printed circuit assemblies.

BRIEF SUMMARY

The present invention provides a flexible circuit useful for printed circuit assembly repair. The present invention overcomes the disadvantages in conventional systems for repair of printed circuit assemblies. The present invention entails better yield advantages.

Another object of the present invention is to provide a flexible circuit that enables improved reliability and reduced costs of printed circuit assembly rework.

Another object of the present invention is to provide a flexible circuit that provides insertion of additional function or design options during reworking of defects in printed circuit assemblies.

Another object of the invention is to provide additional wiring capability in localized high wiring density area of a printed circuit assembly, without adding additional wiring layers across entire printed circuit assembly board.

Another object of the present invention is to provide an improved probing technique using the flexible circuit of the present invention.

Yet another object of the present invention is to enable a flexible circuit to make interconnections in an LGA without adding an extra interposer.

In one embodiment of the invention, a rework device in form of a flexible circuit is provided in order to repair a printed circuit assembly, the printed circuit assembly including one or more through vias and interconnections. The flexible circuit is adapted to be threaded through a through via. The flexible circuit is a planar structure that includes a lead in portion and a tail portion. The flexible circuit also includes a first distended head portion proximal to the lead in portion and a second distended head portion proximal to the tail portion. Further, the second distended head portion is connected to the first distended head portion through a coverlay portion which may be of varying lengths, such that the length of the coverlay portion is substantially equal to a depth of the through via.

In an another embodiment of the invention, a rework device in form of a flexible circuit is provided in order to repair a printed circuit assembly, the printed circuit assembly including one or more through vias and interconnections. The flexible circuit is adapted to be threaded through a through via. The flexible circuit includes a lead in portion and a tail portion. The flexible circuit also includes a first distended head portion proximal to the lead in portion and a second distended head portion proximal to the tail portion. Further, the second distended head portion is connected to the first distended head portion through a coverlay portion, such that the coverlay portion includes a looped segment. In embodiments of the invention, the looped segment can be a coiled segment or a helical segment as per the different use the flexible circuit needs to be put to.

In yet another embodiment of the invention, a rework device in form of a flexible circuit is provided in order to repair a printed circuit assembly, the printed circuit assembly including one or more through vias and interconnections. The flexible circuit is adapted to be threaded through a through via. The flexible circuit is structured to include multiple branches. The multiple branches in the flexible circuit is configured to be threaded through a through via. The flexible circuit includes a plurality of lead in portions and a plurality of tail portions. Further, the flexible circuit also includes a plurality of first distended head portions corresponding to the plurality of lead in portions and a plurality of second distended head portions corresponding to the plurality of tail portions. The plurality of second distended head portions and the plurality of first distended head portions being through corresponding coverlay portions.

In yet another embodiment of the present invention, a debug probing device is provided. The debug probing device being configured to debug probing of a defective printed circuit assembly. The debug probing includes a plurality of leader threads connected to the debug probing device. Further each of the plurality of leader threads has a connected rework device that can be threaded into through vias of a defective printed circuit assembly.

These and other exemplary embodiments, features and advantages of the present invention will be described or become apparent from the following detailed description of exemplary embodiments, which is to be read in connection with the accompanying drawings.

BRIEF DESCRIPTION OF DRAWINGS

The features of the present invention, which are believed to be novel, are set forth with particularity in the appended claims. The invention may best be understood by reference to the following description, taken in conjunction with the accompanying drawings. These drawings and the associated description are provided to illustrate some embodiments of the invention, and not to limit the scope of the invention.

Figure 1:
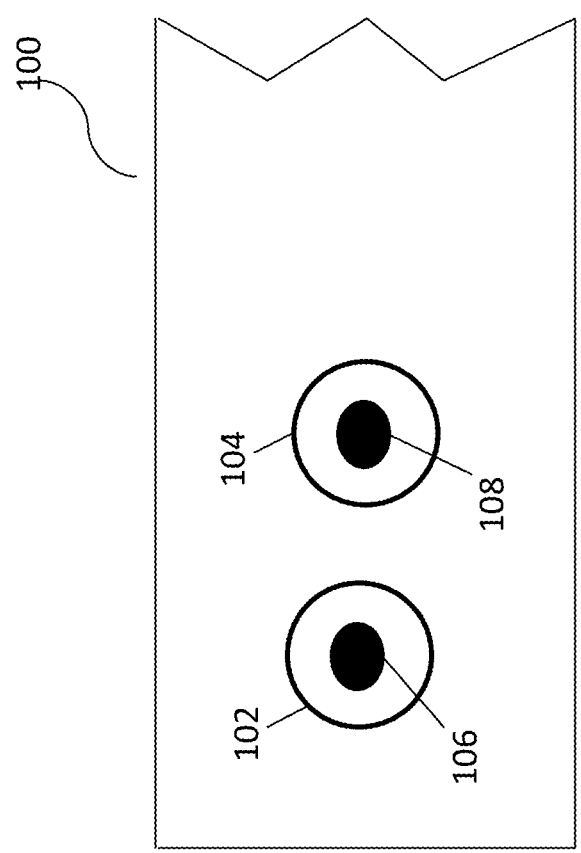
FIG. 1 is a top view of a portion of an exemplary printed circuit assembly with two circular contact pads, in accordance with an embodiment of the present invention.

Those with ordinary skill in the art will appreciate that the elements in the figures are illustrated for simplicity and clarity and are not necessarily drawn to scale. For example, the dimensions of some of the elements in the figures may be exaggerated, relative to other elements, in order to improve the understanding of the present invention.

There may be additional structures described in the foregoing application that are not depicted on one of the described drawings. In the event such a structure is described, but not depicted in a drawing, the absence of such a drawing should not be considered as an omission of such design from the specification.

DETAILED DESCRIPTION

Before describing the present invention in detail, it should be observed that the present invention utilizes a combination of method steps and apparatus components related to a rework device for repairing printed circuit assemblies. Accordingly the apparatus components and the method steps have been represented where appropriate by conventional symbols in the drawings, showing only specific details that are pertinent for an understanding of the present invention so as not to obscure the disclosure with details that will be readily apparent to those with ordinary skill in the art having the benefit of the description herein.

While the specification concludes with the claims defining the features of the invention that are regarded as novel, it is believed that the invention will be better understood from a consideration of the following description in conjunction with the drawings, in which like reference numerals are carried forward.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

The terms "a" or "an", as used herein, are defined as one or more than one. The term "another", as used herein, is defined as at least a second or more. The terms "including" and/or "having" as used herein, are defined as comprising (i.e. open transition). The term "coupled" or "operatively coupled" as used herein, is defined as connected, although not necessarily directly, and not necessarily mechanically.

The present invention, according to preferred embodiments, provides rework device in form of a flexible circuit for repair or rework of a printed circuit assembly including of one or more through vias, such that the flexible circuit is configured to be threaded through a through via of the printed circuit assembly.

Referring to FIG. 1, there is shown a top view of a portion of an exemplary printed circuit assembly 100, including but not limited to a prism to prism flex board, having two contact pads 102 and 104. The two contact pads 102 and 104 are electrically coupled to two through via 106 and 108 respectively. A "through via" is a plated hole that connects one or more conductive pathways on one surface of a circuit board, for example the printed circuit assembly 100, to conductive pathways on opposite surfaces of the circuit board, for example the printed circuit assembly 100.

Figure 2:
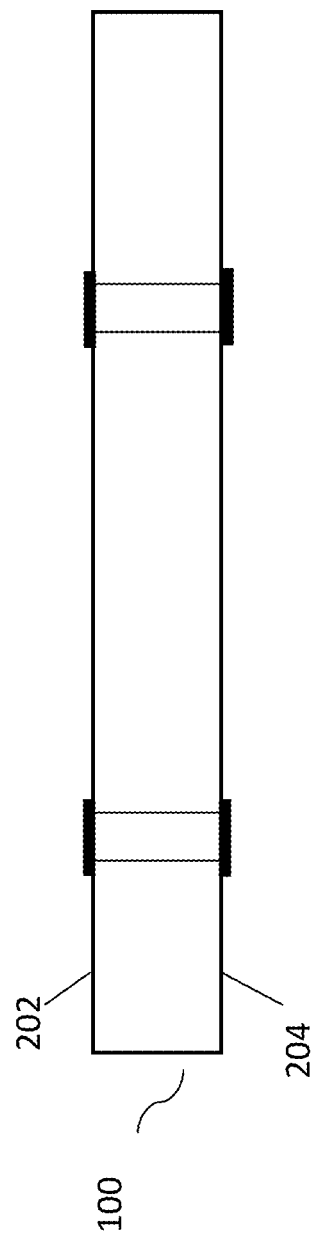
FIG. 2 is a side view of the printed circuit assembly of FIG. 1 illustrating through vias and conductive layers, in accordance with an embodiment of the present invention.

Moving on, in FIG. 2, there is illustrated a side view of the printed circuit assembly 100. Each of the through vias 106 and 108 is shown to connect an upper surface 202 of the printed circuit assembly 100 and travel down to a bottom surface 204 of the printed circuit assembly 100. Further, each of the through vias 106 and 108 are illustrated as a hole that is drilled or formed in the printed circuit assembly 100. The through vias 106 and 108 provide electrical communication between different elements placed on the printed circuit assembly.

Figure 3:
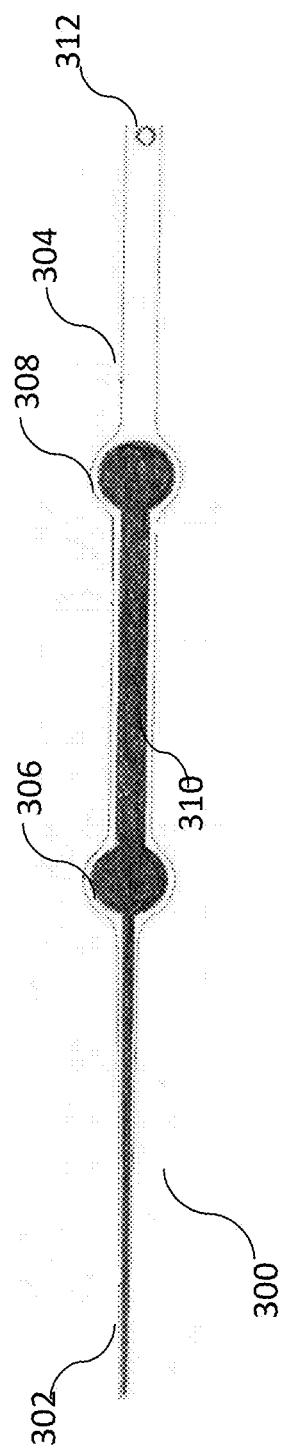
FIG. 3 is a diagrammatic illustration of an exemplary flexible circuit, in accordance with an embodiment of the present invention.

Referring to FIG. 3, there is illustrated an exemplary rework device in the form of a flexible circuit 300, that can be used in rework or repair of a printed circuit assembly, for example the printed circuit assembly 100. The flexible circuit 300 has a planar structure and includes a lead in portion 302, a tail portion 304, a first distended head portion 306, a second distended head portion 308, a coverlay portion 310 and an alignment portion 312. In an embodiment, the lead in portion 302 and the tail portion 304 can be a detachable portion.

Coverlay portion 310 is a solid, tack-free film comprising one or more layers, each of which is formed from one or more flexible dielectric adhesive polymers. As used herein, "polymer" includes homopolymers, co-polymers, terpolymers, etc. Preferably, coverlay 310 comprises a single layer formed from one dielectric adhesive polymer or from a mixture of dielectric adhesive polymers.

Further it should be appreciated that in the figure, though the flexible circuit is shown to include only one lead in portion 302, one tail portion 304, one first distended head portion 306, one second distended head portion 308, one coverlay portion 310 and one alignment portion 312, other embodiments of the present invention may include more than one such elements, without deviating from the scope of the present invention.

Through the lead in portion 302, a leader thread can enter and guide the flexible circuit 300 to be threaded through a through via. The flexible circuit 300 enters a through via from the lead in portion 302. The first distended head portion 306 is proximal to the lead in portion 302 and the second distended head portion 308 is proximal to the tail portion 304. While reworking, the first distended head portion 306 emerges from a bottom surface of a through via through which the flexible circuit 300 has been threaded. The second distended head portion 308 remains on the opposite surface of the through via when the flexible circuit 300 has been threaded. The first distended head portion 306 and the second distended head portion 308 are so structured that they substantially conform to the two holes on the two surfaces of the through via. In an embodiment, the first distended head portion 306 and the second distended head portion 308 may be laminated with, but not limited to, a pressure sensitive adhesive, an epoxy, a thermoset or any other adhesive to respective surfaces of the printed circuit assembly 100.

Moving on, the first distended head portion 306 and the second distended head portion 308 of the flexible circuit 300 are connected using the coverlay portion 310. The arrangement of the first distended head portion 306, the second distended head portion 308 and the coverlay portion 310 is such that after reworking there is no perceptible protrusion in the printed circuit assembly. This is ensured by keeping the length of the coverlay portion 310 substantially equal to that of a depth of the through via. This reworking process will be explained in more detail in association with FIGS. 7a, 7b and 7c.

The flexible circuit 300 also includes the alignment portion 312 that is configured to properly align the flexible circuit 300 on the printed circuit assembly during repair or rework process.

In an embodiment, the breadth of the coverlay portion 310 may be at least 0.03 inches, preferably they may vary from 0.04 inches to 0.08 inches. However, it should be appreciated that in other embodiments of the invention, other dimensions as suitable for reworking of the printed circuit assembly can also be used without deviating from the scope of the invention.

Similarly, dimensions of the first distended head portion 306 and the second distended head portion 308 may be at least 0.01 inches, preferably they may range from 0.02 inches to 0.03 inches. In embodiments, the first distended head portion 306 and the second distended head portion 308 may be in the form of a spherical or circular bulbous structure having a diameter in the mentioned range. However, it should be appreciated that in other embodiments of the invention, other dimensions as suitable for reworking of the printed circuit assembly can also be used without deviating from the scope of the invention.

Figure 4:
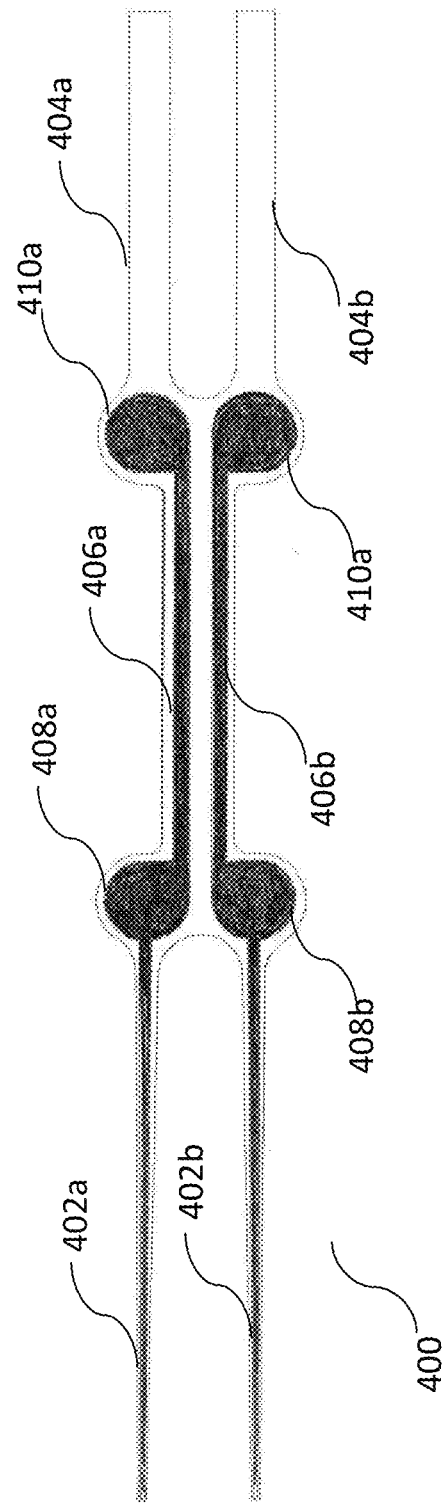
FIG. 4 is a diagrammatic illustration of an exemplary flexible circuit having a plurality of branches, in accordance with an embodiment of the present invention.

In other embodiments, the flexible circuit 300 may be substantially completely or at least partially covered with a suitable kapton or some similar purpose material layer running from the lead in portion 302 up to the tail portion 304. In an embodiment, the kapton layer may be made up of, but not limited to a nickel based material, a ferrous based material and a gold based material. In an embodiment, the kapton layer may be a solder leveling or any other metal based platings Moving on, in FIG. 4 there is depicted a flexible circuit 400 according to another embodiment of the present invention. The flexible circuit 400 is shown to include two separate branches and each branch has separate elements of a flexible circuit. For example, the flexible circuit 400 contains two lead in portions like 402a and 402b. Further it should be appreciated that in the figure, though the flexible circuit is shown to include only two branches, other embodiments of the present invention may include more than two such branches, without deviating from the scope of the present invention.

The flexible circuit 400 is shown to include two tail portions 404a and 404b, two first distended head portions 408a and 408b corresponding to the two lead in portions 402a and 402b, two second distended head portions 410a and 410b corresponding to the two tail portions 404a and 404b with help of corresponding coverlay portions 406a and 406b.

It should be appreciated that individual elements of the flexible circuit 400 are similar in structure, features and functionality to the ones defined in conjunction with the flexible circuit 300.

Figure 5:
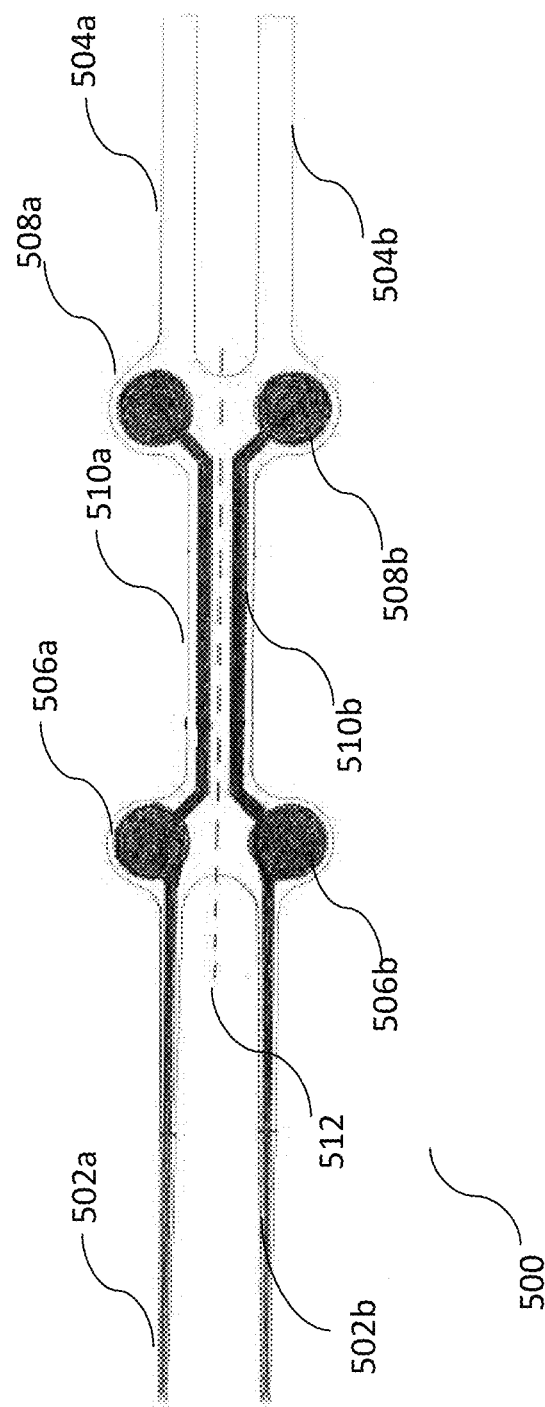
FIG. 5 is a diagrammatic illustration of another exemplary flexible circuit having a plurality of branches, in accordance with another embodiment of the present invention.

Moving on, FIG. 5 depicts a multiple branched flexible circuit 500 in accordance with another exemplary embodiment of the present invention, The flexible circuit 500 can form a differential pair when the flexible circuit 500 is threaded through a through via. However, it should be appreciated that in other embodiments of the invention other similar electrical circuits can also be formed without deviating from the scope of the invention.

The flexible circuit 500 is shown to include two lead in portions 502a and 502b through which the flexible circuit 500 is threaded through a through via. The flexible circuit 500 also includes two tail portions 504a and 504b. The flexible circuit further includes corresponding two first distended head portions 506a and 506b and two second distended head portions 508a and 508b, such that they are connected through corresponding coverlay portions 510a and 510b.

Also illustrated is a fold line 512, along which the flexible circuit 500 may be folded to be converted into a differential pair, while being threaded through the through via. However, it should be appreciated that in other embodiments of the invention other similar arrangement like discrete electrical components which might be one of, but not limited to, an active component, an embedded resistance, an embedded capacitance, and a fuse can also be formed using the flexible circuit 500 without deviating from the scope of the invention.

Again, it should be appreciated that in the figure, though the flexible circuit is shown to include only two branches, other embodiments of the present invention may include more than two such branches, without deviating from the scope of the present invention. Also, it should be appreciated that individual elements of the flexible circuit 500 are similar in structure, features and functionality to the ones defined in conjunction with the flexible circuit 400 and the flexible circuit 300.

Figure 6:
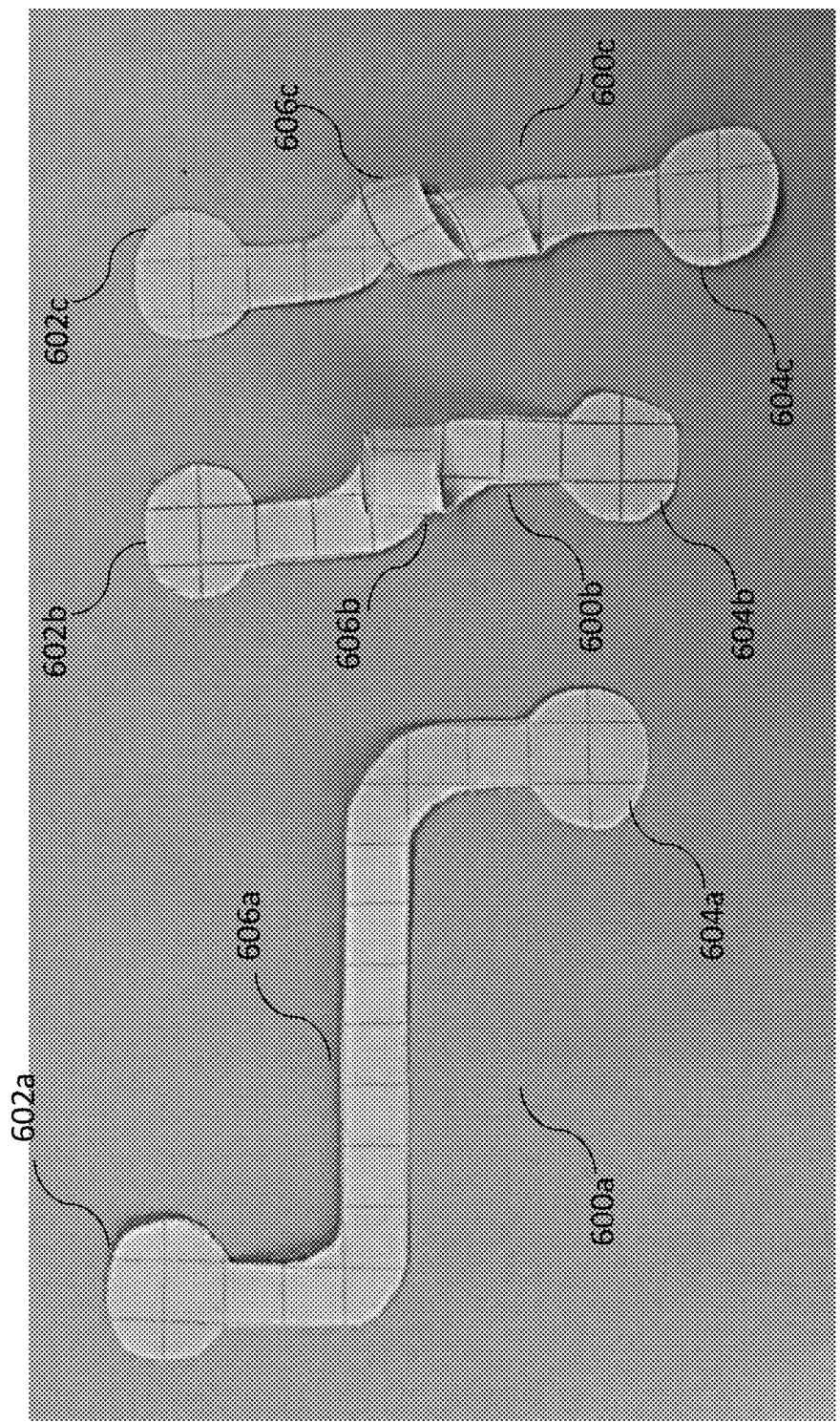
FIG. 6 is a diagrammatic illustration of exemplary flexible circuits having different coverlay portions, in accordance with another embodiment of the present invention.

Referring to FIG. 6, there are depicted partial portions of three flexible circuits 600a, 600b and 600c, in accordance with another exemplary embodiment of the present invention. The flexible circuits 600a, 600b and 600c include first distended head portions 602a, 602b and 602c respectively connected to second distended head portions 604a, 604b and 604c respectively through coverlay portions 606a, 606b and 606c.

In embodiments of the present invention, the coverlay portion 606a of the flexible circuit 600a may be in form of a looped segment that is looped so as to form a coil as depicted by the coverlay portion 606b of the flexible circuit 600b or a helix as depicted by the coverlay portion 606c of the flexible circuit 600c so as to form a small inductive portion within the flexible circuit 600b and the flexible circuit 600c. In an embodiment, the looped portion can be any one of a coil shape, a helical shape and a spiral shape. Further in an embodiment, the at least one looped segment is positioned within the at least one through via.

The coiled coverlay portion 606b or the helix coverlay portion 606c are completely housed in the through via through which the flexible circuit 600b or 600c will be threaded.

In an embodiment, the flexible circuits 600b or 600c may be covered with a ferrous like material in order to increase the potential value of the inductance.

Again, it should be appreciated that individual elements of the flexible circuits 600a, 600b and 600c are similar in structure, features and functionality to the ones defined in conjunction with the flexible circuit 500, the flexible circuit 400 and the flexible circuit 300.

Figure 7:
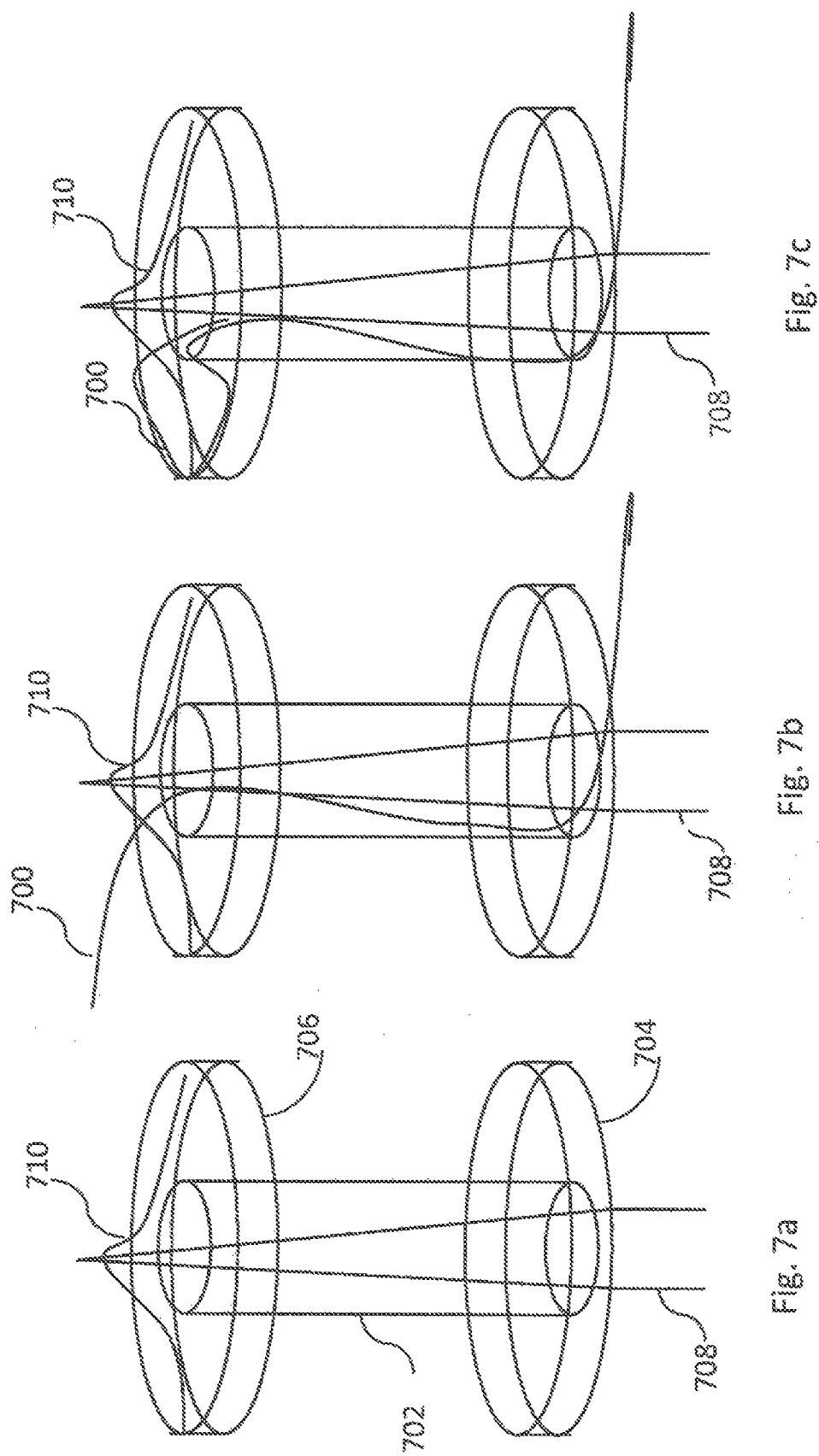
FIGS. 7a, 7b and 7c are diagrammatic illustration of exemplary stages of repairing of a printed circuit assembly using an exemplary flexible circuit, in accordance with an embodiment of the present invention.

Moving on there is depicted in FIGS. 7a, 7b and 7c different stages of threading a flexible circuit 700 through a defective through via 702 of a printed circuit assembly containing a first contact pad 704 and a second contact pad 706. A pin hole connector 708 as shown in the figure helps in interconnection of electrical components in a printed circuit assembly. The pin hole connector 708 runs through the defective through via 702 from the first contact pad 704 where electrical components are present, to the second contact pad 706. The pin hole connector 708 is shown to be soldered at 710.

The flexible circuit 700 is threaded through the defective through via 702 in FIG. 7b, the flexible circuit 700 is entered from the first contact pad 704, through the through via 702, and emerges from the second contact pad 706. The flexible circuit 700 is then soldered at the point 710 in order to repair the defective through via 702.

Figure 8:
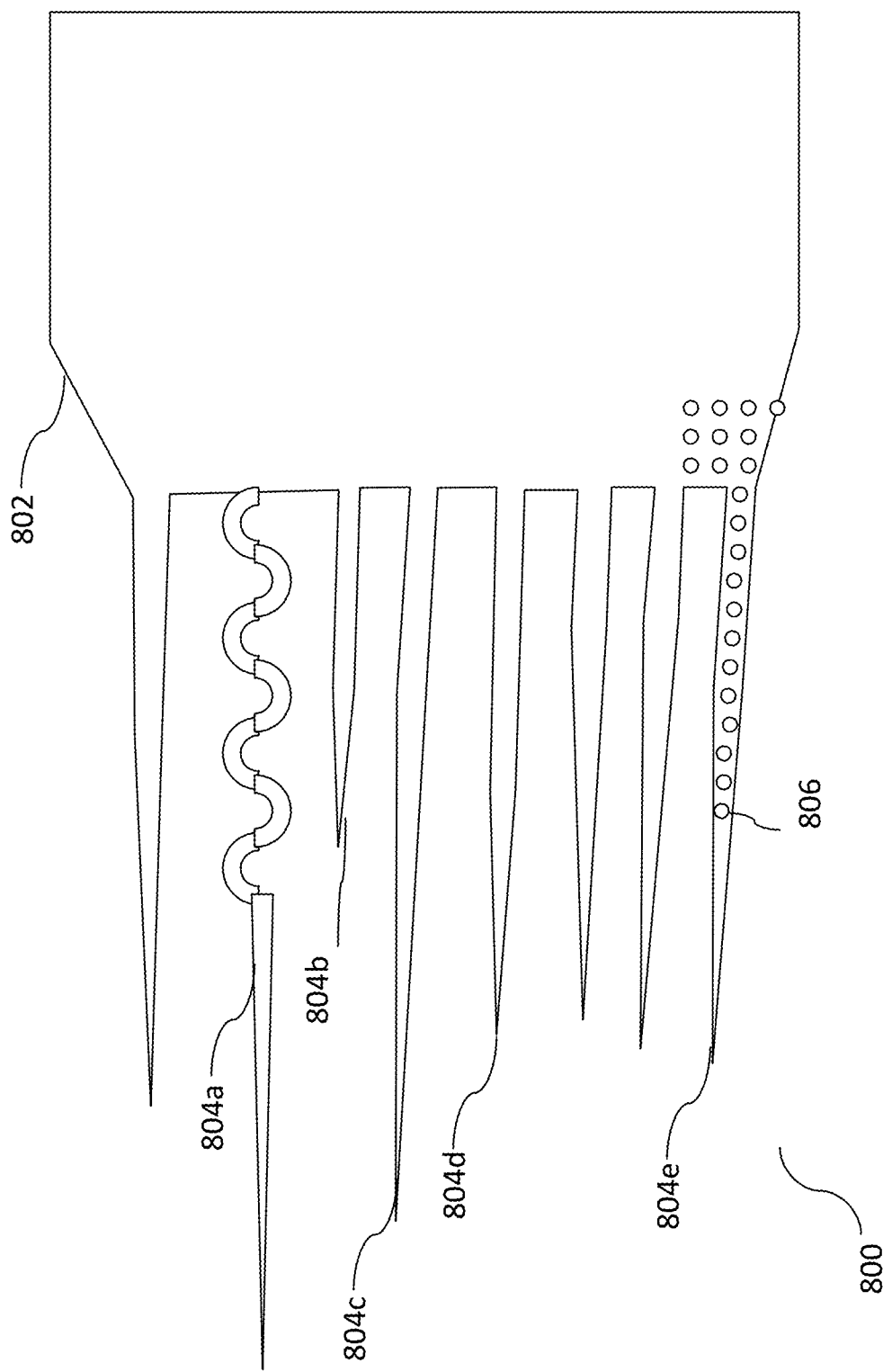
FIG. 8 is a diagrammatic illustration of an exemplary debug probing device used for probing a printed circuit assembly, in accordance with an embodiment of the present invention.

Moving on, in FIG. 8 there is depicted an exemplary debug probing device 800, in accordance with an embodiment of the present invention. The debug probing device 800 can be used for probing a printed circuit assembly without damaging interconnection of electrical components present on the printed circuit assembly. Also, such a debug probing device eliminates additional wiring which may be required to be done in order to connect any conventional debug probing device to the printed circuit assembly 100.

The debug probing device 800 includes a bulk portion 802 and a plurality of leader threads like 804a, 804b, 804c, 804d and 804e of different shapes and different sizes. The plurality of leader threads 804a, 804b, 804c, 804d and 804e may be connected to the flexible circuit 300 as depicted in FIG. 3

Some shapes of the leader threads 804a, 804b, 804c, 804d and 804e may include, but are not limited to, s-shaped, zigzag shaped, snake shaped etc. These different leader threads have different advantages and can help cater to different types of through vias. For example, in an embodiment illustrated by the leader thread 804e and the bulk portion 802, the leader thread 804e is shown to include a plurality of openings 806. The plurality of openings 806 are provided so as to allow clearance for through vias, surface features or keep out zones.

Figure 9:
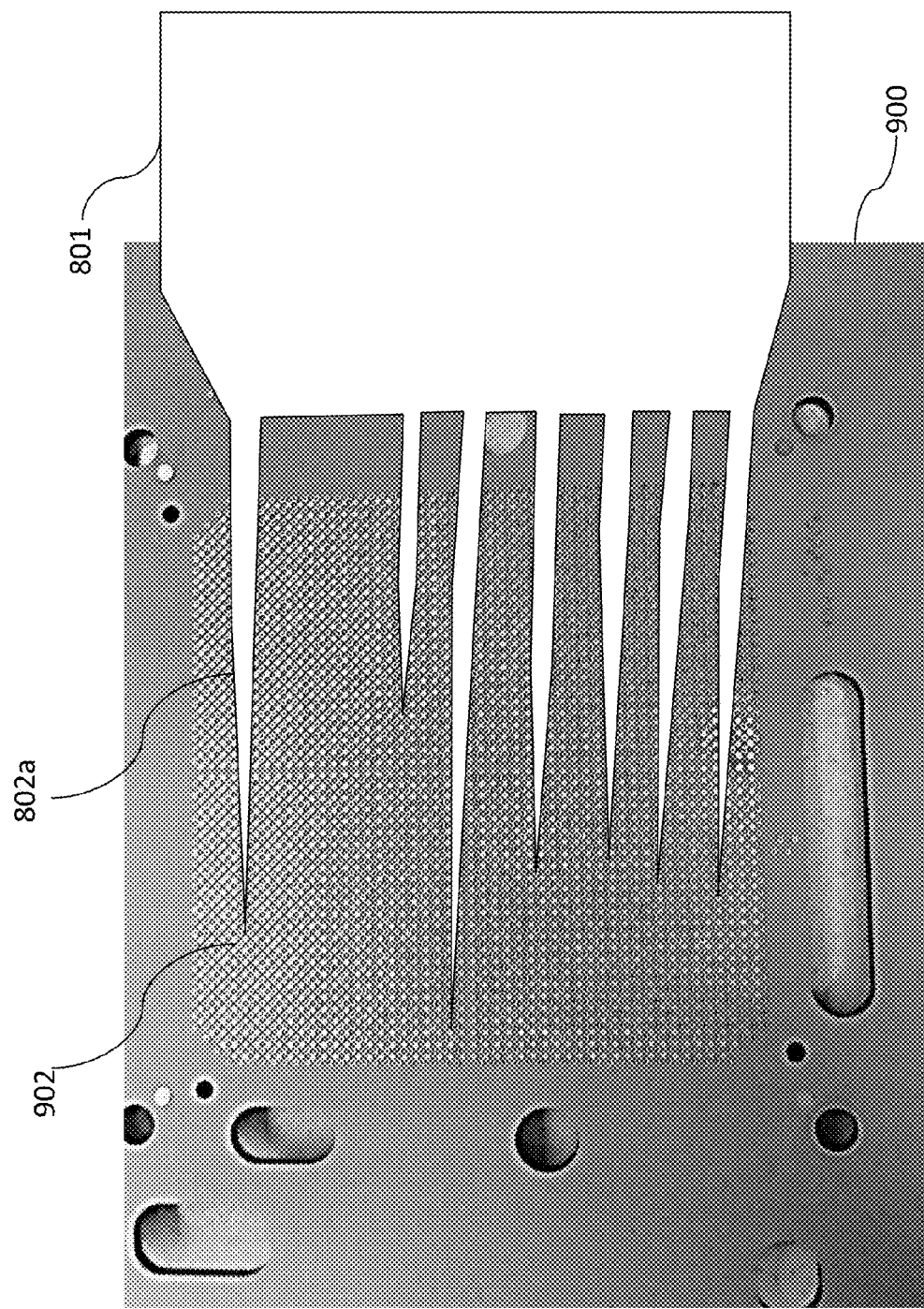
FIG. 9 is a diagrammatic illustration of a stage of using a debug probing device for probing a printed circuit assembly, in accordance with another embodiment of the present invention.

Moving on there is shown in FIG. 9, an exemplary method of using the debug probing device 800 on a printed circuit assembly 900. For example, in the depicted method, the leader thread 802a is inserted through a through via 902 in order to probe on a surface of the printed circuit assembly 900. If any defect is found in the through via 902 a flexible circuit connected to the leader thread 802a can be threaded in order to repair the defective through via 902.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

All documents referenced herein are hereby incorporated by reference.

What is claimed is:

1. A design and rework device for use in creating in or thru via and repair of a printed circuit assembly, the printed circuit assembly having at least one through via, the design and rework device being in form of a planar flexible circuit, the planar flexible circuit comprising:
    a lead-in portion at one end of the planar flexible circuit, the planar flexible circuit configured to be threaded through a selected one of the at least one through via using the lead-in portion;
    a tail portion at an opposite end of the planar flexible circuit, the tail portion configured to align the planar flexible circuit on a surface of the printed circuit assembly;
    a first distended head portion proximal to the lead-in portion; and
    a second distended head portion proximal to the tail portion, the second distended head portion being connected to the first distended head portion by a flex portion, wherein a length of the flex portion is substantially equal to a depth of the selected through via,
    wherein threading of the planar flexible circuit through the selected through via positions the first distended head portion on one surface of the printed circuit assembly and positions the second distended head portion on an opposite surface of the printed circuit assembly.

2. The design and rework device according to claim 1, wherein the printed circuit assembly is a chip to chip interconnect device.

3. The design and rework device according to claim 1, wherein lead-in portion and the tail portion are removable.

4. The design and rework device according to claim 1, wherein the first distended head portion and the second distended head portion substantially conform to two ends of the at least one through via.

5. The design and rework device of claim 1, wherein the design and rework device is laminated, after the threading, to an upper surface of the printed circuit assembly and to a bottom surface of the printed circuit assembly with at least one of a pressure sensitive adhesive, a thermoset, and an epoxy.

6. The design and rework device of claim 1, wherein the design and rework device is coated at least partially with at least one of a nickel based material, a gold based material, solder leveling, and other metal based plating.

7. The design and rework device of claim 1 further comprising discrete electronic components selected from the group of active components, passive components, fuses and combinations thereof.

8. The rework device of claim 1, wherein a breadth of the flex portion is at least 0.03 inches.

9. The rework device of claim 1, wherein a diameter of the distended first head portion and of the distended second head portion is at least 0.01 inches.

10. The design and rework device of claim 1, wherein after the threading, the first distended head portion is laminated to the one surface of the printed circuit assembly and the second distended head portion is laminated to the opposite surface of the printed circuit assembly using at least one of a pressure sensitive adhesive, a thermoset, and an epoxy.

11. The design and rework device of claim 1, wherein a result of the threading leaves no perceptible protrusion in the printed circuit assembly.

12. A design and rework device for use in creating in or thru via and repair of a printed circuit assembly, the printed circuit assembly having at least one through via, the design and rework device being in form of a flexible circuit, the flexible circuit comprising:

at least one lead-in portion at one end of the flexible circuit, the flexible circuit configured to be threaded through a selected one of the at least one through via using at least one of the at least one lead-in portion;

at least one tail portion at an opposite end of the flexible circuit, the at least one tail portion configured to align the flexible circuit on a surface of the printed circuit assembly;

at least one first distended head portion proximal to the at least one lead-in portion;

at least one second distended head portion proximal to the at least one tail portion, wherein the at least one second distended head portion is connected to the at least one first distended head portion by a flex portion, the flex portion having at least one looped segment, wherein the flex portion is substantially completely housed in the selected through via after the threading, such that a result of the threading leaves no perceptible protrusion in the printed circuit assembly.

13. The design and rework device according to claim 12, wherein the at least one looped segment has a shape selected from the group comprising a coil shape, a helical shape and a spiral shape, further wherein the at least one looped segment is positioned within the selected through via.

14. The design and rework device according to claim 12, wherein the printed circuit assembly is a chip to chip interconnect device.

15. The design and rework device according to claim 12, wherein the at least one lead-in portion and the at least one tail portion are removable.

16. The design and rework device according to claim 12, wherein the at least one first distended head portion and the at least one second distended head portion substantially conform to two ends of the at least one through via.

17. The design and rework device of claim 12, wherein the design and rework device is laminated, after the threading, to an upper surface of the printed circuit assembly and to a bottom surface of the printed circuit assembly with at least one of a pressure sensitive adhesive, a thermoset, and an epoxy.

18. The design and rework device of claim 12, wherein the design and rework device is coated at least partially with at least one of a nickel based material, a gold based material, solder leveling, and other metal based plating.

19. The design and rework device of claim 12 further comprising discrete electronic components selected from the group of active components, passive components, fuses and combinations thereof.

20. The rework device of claim 12, wherein a breadth of the coverlay portion is at least 0.03 inches.

21. The rework device of claim 12, wherein a diameter of the distended first head portion and of the distended second head portion is at least 0.01 inches.

22. A design and rework device for use in creating in or thru via and repair of a printed circuit assembly, the printed circuit assembly having at least one through via, the design and rework device being in form of a branched circuit having a plurality of branches, the branched flexible circuit comprising:

a plurality of lead-in portions at one end of the planar flexible circuit, wherein a number of the plurality of lead-in portions correspond to a number of the plurality of branches, the branched flexible circuit configured to be threaded through a selected one of the at least one through via using at least one of the plurality of lead-in portions;

a plurality of tail portions corresponding to the plurality of lead-in portions, the plurality of tail portions being located at an opposite end of the branched flexible circuit and configured to align the branched flexible circuit on a surface of the printed circuit assembly;

a plurality of first distended head portions corresponding to the plurality of lead-in portions, the plurality of first distended head portions proximal to the plurality of lead-in portions;

a plurality of second distended head portions corresponding to the plurality of tail portions, the plurality of second distended head portions proximal to the plurality of tail portions, the plurality of second distended head portions being connected to the plurality of first distended head portions by a flex portion, wherein a length of the flex portion is substantially equal to a depth of the selected through via such that a result of the threading leaves no perceptible protrusion in the printed circuit assembly.

\* \* \* \* \*